United States Patent
Ha et al.

(10) Patent No.: US 9,096,140 B2
(45) Date of Patent: Aug. 4, 2015

(54) MANAGEMENT OF THE RECHARGING OF A SET OF BATTERIES

(75) Inventors: Duy Long Ha, Chambery-le-Vieux (FR); Sylvie Genies, Saint Egreve (FR)

(73) Assignee: Commissariat a L'energie Atomique et aux Energies Alternatives, Paris (FR)

( * ) Notice: Subject to any disclaimer, the term of this patent is extended or adjusted under 35 U.S.C. 154(b) by 457 days.

(21) Appl. No.: 13/504,375

(22) PCT Filed: Oct. 20, 2010

(86) PCT No.: PCT/EP2010/065761
§ 371 (c)(1),
(2), (4) Date: Apr. 26, 2012

(87) PCT Pub. No.: WO2011/051144
PCT Pub. Date: May 5, 2011

(65) Prior Publication Data
US 2012/0212173 A1   Aug. 23, 2012

(30) Foreign Application Priority Data
Oct. 29, 2009   (FR) ...................................... 09 57622

(51) Int. Cl.
*H02J 7/00* (2006.01)
*H01M 10/46* (2006.01)
(Continued)

(52) U.S. Cl.
CPC ............. *B60L 11/1816* (2013.01); *G01R 31/36* (2013.01); *H02J 7/0027* (2013.01); *H02J 2003/146* (2013.01); *H02J 2007/005* (2013.01);
(Continued)

(58) Field of Classification Search
CPC ... B60L 11/1816; G01R 31/36; H02J 7/0027; H02J 2003/146; H02J 2007/0049; H02J 2007/0055; Y02T 90/121; Y02T 90/14; Y02T 10/7094; Y02Y 10/7055
USPC .................................................... 320/101, 162
See application file for complete search history.

(56) References Cited

U.S. PATENT DOCUMENTS

| 5,315,227 A | 5/1994 | Pierson et al. |
| 5,548,200 A | 8/1996 | Nor et al. |

(Continued)

FOREIGN PATENT DOCUMENTS

| DE | 19519107 C | 5/1995 |
| JP | 2004-229356 A | 8/2004 |

(Continued)

OTHER PUBLICATIONS

Notice of Reasons for Rejection issued by Japanese Patent Office for corresponding application JP 2012-535743, mailing date Jun. 10, 2014, English translation only.

(Continued)

*Primary Examiner* — Vuthe Siek
(74) *Attorney, Agent, or Firm* — Frommer Lawrence & Haug LLP; Ronald R. Santucci

(57) ABSTRACT

Method for managing the recharging of at least one battery, characterized in that it comprises a transmission of a desired charge level ($C^i$) for a battery (i) at a given instant ($T^i$) such that the recharging enables the battery (i) to reach a charge level ($C(i)$) greater than or equal to the desired charge level ($C^i$) at the given instant.

11 Claims, 2 Drawing Sheets

(51) Int. Cl.
*B60L 11/18* (2006.01)
*G01R 31/36* (2006.01)
*H02J 3/14* (2006.01)

(52) U.S. Cl.
CPC ...... *H02J 2007/0049* (2013.01); *Y02T 10/7005* (2013.01); *Y02T 10/7055* (2013.01); *Y02T 10/7094* (2013.01); *Y02T 90/14* (2013.01); *Y02T 90/168* (2013.01); *Y04S 30/12* (2013.01)

(56) References Cited

U.S. PATENT DOCUMENTS

| | | |
|---|---|---|
| 5,790,976 A | 8/1998 | Boll et al. |
| 5,847,537 A | 12/1998 | Parmley, Sr. |
| 2008/0238357 A1* | 10/2008 | Bourilkov et al. ............ 320/106 |
| 2011/0264319 A1* | 10/2011 | Chander et al. ................ 701/22 |

FOREIGN PATENT DOCUMENTS

| | | |
|---|---|---|
| JP | 2009-118652 A | 5/2009 |
| JP | 2009-136109 A | 6/2009 |
| JP | 2009-240150 A | 10/2009 |

OTHER PUBLICATIONS

Notice of Reasons for Rejection issued by Japanese Patent Office for corresponding application JP 2012-535743, mailing date Jan. 27, 2015, English translation only.

* cited by examiner

MANAGEMENT OF THE RECHARGING OF A SET OF BATTERIES

This application is a 371 of PCT/EP2010/065761 filed on Oct. 20, 2010, published on May 5, 2011 under publication number WO 2011/051144, which claims priority benefits from French Patent Application Number 09/57622 filed Oct. 29, 2009, the disclosure of which is incorporated herein by reference.

The invention relates to a method for managing the recharging of at least one battery and a battery recharging device implementing such a method.

There are numerous devices which operate using a battery, such as, for example, electric or hybrid vehicles. When the user of such an electric device sees that the charge of its battery is too low, he or she connects it to a recharging device which uses an electrical energy source supplying a battery recharging current.

When the electric device concerned is an electric vehicle, the battery recharging device may take the form of a shelter defining a parking space and electrically equipped for the electrical connection with the battery. Such a shelter may be equipped with photovoltaic panels generating an electrical energy which is used for the recharging of the battery of the vehicle. In practice, the driver positions his or her vehicle under the shelter, connects it electrically to the energy source of the shelter to immediately initiate the recharging of the battery. The recharging phase is then automatically stopped by the recharging device as soon as the battery reaches its full charge.

The existing recharging devices are not optimized. In fact, the recharging of the different batteries is initiated as soon as they are electrically connected, with their full charge being the objective. Now, this recharging may require an energy originating from a costly and/or polluting electricity production source when recharging the battery. Furthermore, this energy source may be inadequate at a given instant, especially if a number of batteries are being charged simultaneously and/or if renewable energy sources are used, such as a solar or wind turbine source, which is, by its nature, fluctuating. Also, the total recharging of each battery is perhaps not necessary for the planned future use.

Thus, there is a need for an intelligent management method for the recharging of one or more batteries of an electric device.

A general aim of the invention is therefore to propose an optimized management solution for the recharging of at least one battery of an electric device, which addresses all or some of the following particular aims:

A first aim of the invention is to propose a solution for recharging a battery with an optimized cost and optimal energy efficiency.

A second aim of the invention is to propose a solution for recharging a battery with minimal impact for the environment.

A third aim of the invention is to propose a solution for recharging a battery that is compatible with the recharging of a number of batteries, of a maximum of batteries simultaneously.

To this end, the invention relies on a method for managing the recharging of at least one battery, characterized in that it comprises a transmission of a desired charge level ($C^i$) for a battery (i) at a given instant ($T^i$) such that the recharging enables the battery (i) to reach a charge level (C(i)) greater than or equal to the desired charge level ($C^i$) at the given instant.

The method for managing the recharging of at least one battery can implement a recharging of each battery (i) to a charge (C(i)) substantially equal to the desired charge ($C^i$), observing the following condition: $C^i \leq C(i) \leq 1.1\, C^i$.

The recharging management method may comprise a step for measuring the initial charge level ($C_0^i$) of a battery (i) then a step for measuring its charge level during recharging.

The method for managing the recharging of at least one battery may use a number of electrical energy production sources (j) for the recharging of a battery and comprise a minimization of the total cost for the recharging of the battery, by minimizing the sum $\Sigma_{j=1}^{J} \int_0^{T_i} \text{Cost}(j, t)\, S(j, t)\, dt$, in which Cost(j, t) represents the cost of a unit of energy produced by a source j at an instant t and S(j, t) represents the quantity of energy produced by a source j for the recharging of a battery at an instant t, J being the number of energy sources.

The method for managing the recharging of at least one battery may comprise a minimization of the environmental impact of the recharging of at least one battery, by minimizing the sum $\Sigma_{j=1}^{J} \int_0^{T_i} \text{Env}(j, t)\, S(j, t)\, dt$, in which Env(j, t) represents the environmental impact of a unit of energy produced by a source j at an instant t.

The method for managing the recharging of at least one battery may comprise a minimization of the total energy $\Sigma_{j=1}^{J} \int_0^{T_i} S(j, t)\, dt$ used for the recharging of at least one battery, and the taking into account of the maximum ($S_{max}^j$) energy available for each production source by the condition $S(j, t) \leq S_{max}^j$.

The method for managing the recharging of at least one battery may take into account the recharging efficiency ($r_i(t)$) of each battery at the instant t, defined by $C(i) = C_0^i + \int_0^{T_i} r_i(t)\, e(i, t)\, dt$, in which $C_0^i$ represents the initial charge level of the battery and e(i, t) represents the recharging energy supplied to each battery i at the instant t.

The invention also relates to a device for recharging at least one battery, comprising an electrical link means with at least one battery, characterized in that it comprises a computer which implements the method for managing the recharging of at least one battery as described previously.

The device for recharging at least one battery may comprise a solar and/or wind turbine electrical energy production means.

The device for recharging at least one battery may comprise a communication means for the transmission of a desired charge level ($C^i$) for a battery (i) at a given instant ($T^i$).

These aims, features and advantages of the present invention will be explained in detail in the following description of a particular embodiment, given as a nonlimiting example in relation to the appended figures in which:

FIG. 1 schematically represents the system implementing the battery recharging method according to one embodiment of the invention.

The invention will be illustrated in the case of a stock of electric vehicles by way of example. Such an electric vehicle may be an electric cycle, an electric car, a self-balancing human transporter, an electric scooter, etc. Naturally, the invention could easily be transposed to any electric device equipped with a battery for its power supply, requiring battery recharging phases. Furthermore, for simplicity, it will be assumed in the following description that each vehicle is equipped with a single battery. However, the method could naturally be applied similarly to vehicles equipped with a number of batteries.

Figure 1:
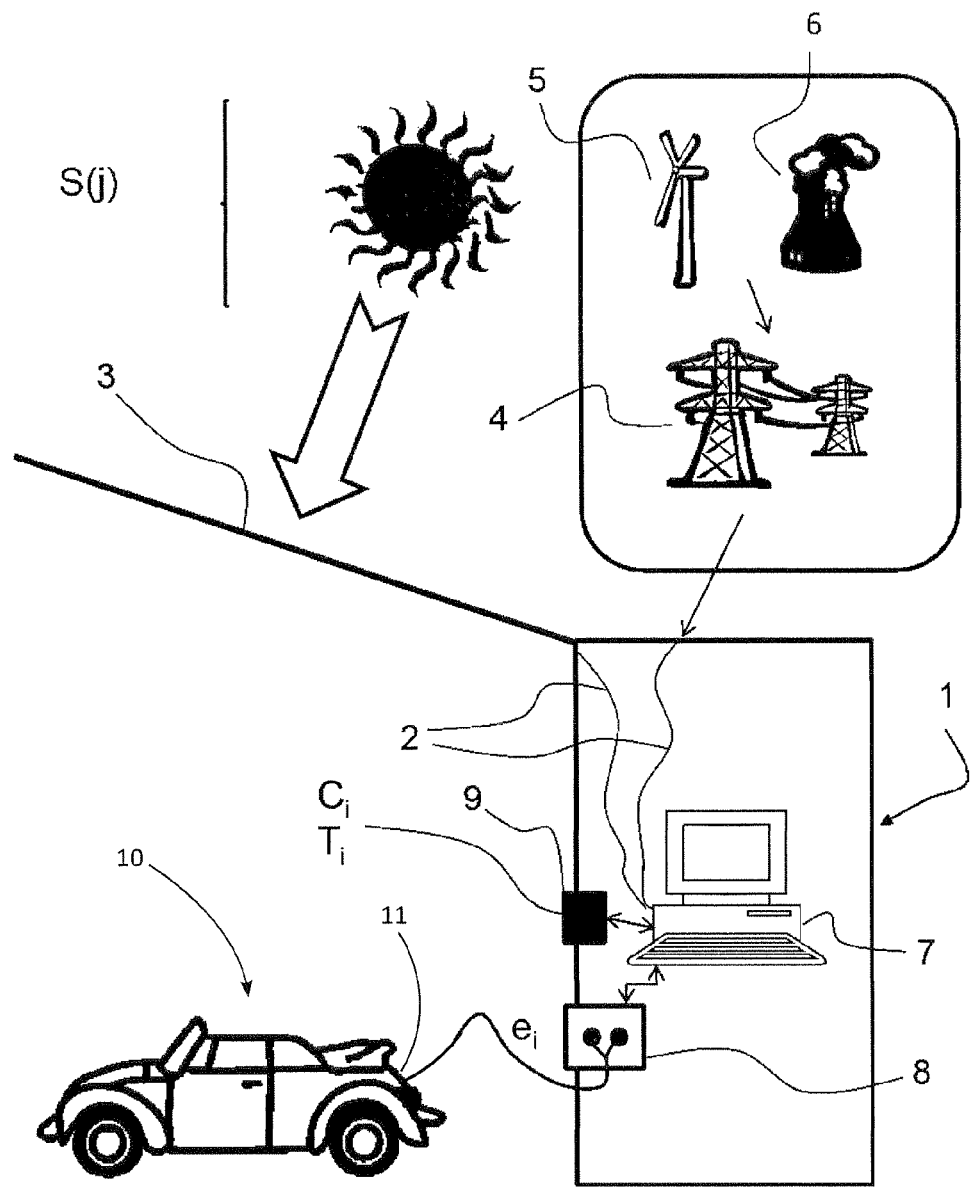

FIG. 1 thus schematically represents a system implementing the battery recharging management method according to one embodiment of the invention in which a battery recharging device 1, linked to one or more electrical energy production sources S(j) by an electrical link 2, comprises a means for recharging the battery 11 of an electric vehicle 10.

The invention relies on the concept of taking into account the recharging need of the battery 11 of an electric vehicle 10. This need generally depends on the planned and known future use of the electric vehicle when its battery is placed on charge.

Thus, an essential step in the method for recharging the battery of the electric vehicle 10 comprises the transmission of the recharging need by the user of the vehicle, or even by the vehicle itself in an automated manner based on route data previously entered by the driver, to the recharging device 1. This need is expressed by the following two parameters:

C represents the desired charge level of the battery,
T represents the instant at which the desired charge level C should be reached, or exceeded.

Then, the battery recharging method as such naturally takes into account this need, such that, at the instant T, the charge of the battery is at least equal to C, preferably substantially equal to or slightly greater than C, advantageously at most 10% greater than this charge C. In the absence of the charge need information, the method performs the full charging of the battery by default.

The charge level represents the quantity of electricity or energy available in the battery. This charge level will be determined at the initial instant ($C_0$ at $t_0$) then regularly, in real or almost-real time during the recharging, by any known method of the prior art, generally based on the measurement of electrical parameters such as the voltage at the terminals of the battery, the temperature and the current over time. The charge level is therefore the parameter on which the method for recharging the battery is based, notably to determine the end of the recharging by the detection of the desired charge C.

The charge level of the battery is measured by a device incorporated in the electric vehicle and associated with the battery. As a variant, this measurement could be made by the recharging device 1.

Furthermore, the model of the particular battery of a given electric vehicle is transmitted to the recharging device, notably in order to deduce therefrom the efficiency r of the recharging method, which is defined as the ratio between the energy leaving the battery to the recharging energy that had to be injected. This efficiency generally depends on the type of the battery, and more specifically on the technology used.

The battery recharging device therefore supplies a certain quantity of recharging energy e to the battery 11, from a certain higher energy quantity u produced by one or more available energy sources S(j) supplying power to the recharging device. Finally, the recharging of the battery can be expressed by the following equations:

$C = C_0 + u$ $u = r\ e$ in which C is the final charge level obtained and $C_0$ is the initial charge level.

The battery recharging method according to the embodiment of the invention takes into account the fact that the electrical energy available at any instant from the recharging device is not infinite, and depends on the different sources connected to the recharging device. This energy S(j) available for each energy source j is therefore uprated by a maximum $S_{max}^{\ j}$.

The battery recharging method relies on the use of J electrical energy production sources j which produce an electrical energy S(j) which is used by the battery recharging device which transmits an electrical energy e(i) to each battery i. This production of energy S(j) incurs a cost Cost(j) and an environmental impact Env(j) for each unit of energy produced, which can be measured, including for example the release of $CO_2$ into the atmosphere. All these parameters are variable over time.

Finally, the method implemented by the invention can take into account the presence of a number of batteries i (I batteries in total) to be recharged, to a charge $C^i$ desired at an instant $T^i$, from an initial charge $C_0^{\ i}$.

The battery recharging method therefore solves all or some of the following equations and conditions to deduce therefrom the charge conditions of each battery, from which electrical production source and at which moment:

At the instant $T^i$, the charge $C^i$ observes $C(i) \geq C^i$ \hfill (1)

$\Sigma_{i=1}^{I} e(i) = \Sigma_{j=1}^{J} S(j)$ \hfill (2)

Minimize $\Sigma_{j=1}^{J} \int_0^{Ti} \text{Cost}(j, t)\ S(j, t)\ dt$ \hfill (3)

Minimize $\Sigma_{j=1}^{J} \int_0^{Ti} \text{Env}(j, t)\ S(j, t)\ dt$ \hfill (4)

Minimize $\Sigma_{j=1}^{J} \int_0^{Ti} S(j, t)\ dt$ \hfill (5)

With $S(j, t) \leq S_{max}^{\ j}$ \hfill (6)

With $C(i) = r_i e(i)$ \hfill (7)

The condition (1) makes it possible to reach the charge level desired by the user for each battery and to fulfil its need. Preferably, the final charge level C(i) sought is substantially equal to the desired charge level $C^i$, exceeding it by a maximum of 10%, and therefore observing the following condition: $C^i \leq C(i) \leq 1.1\ C^i$.

The equation (2) represents the energy balance of the system between the energy produced by the different energy production sources and the energy consumed for the recharging.

The conditions (3) and (4) make it possible to perform the recharging respectively at minimal cost and with a minimal impact on the environment.

The condition (5) makes it possible to perform the recharging with a maximum energy efficiency.

These last three conditions (3), (4), (5) favour recharging during the periods when the renewable energy sources (solar, wind turbine, etc.) offer high electrical production.

The condition (6) takes into account the maximum possible electricity production for each source.

The equation (7) includes the efficiency $r_i$ of the recharging, which depends on the type of the battery i considered. This efficiency of the battery is generally obtained by trial and error. It is generally nonlinear and the embodiment of the invention proposes a temporal discretization of the preceding equations and conditions and a logical transformation by binary variable in order to be able to express them in linear form despite the nonlinear nature of the efficiency r, and facilitate the mathematical solving of these equations, for example by a branch and bound method.

The solving of these conditions and equations makes it possible to obtain the energy S(j) to be produced and take from each energy source j to charge each battery i. This solution also gives the distribution in time of these energies.

By resolving all or some of these conditions and equations, depending on the desired complexity of the implementation of the invention, it is possible to ensure optimal anticipative management of the management of the recharging of the batteries. This solution represents a recharging plan, for a sliding time horizon.

The invention also relates to a recharging device which implements the battery recharging method as defined above. For this, the recharging device 1, schematically represented in FIG. 1, comprises a link 2 with one or more electrical energy production sources S(j). In the example illustrated, it incorporates photovoltaic panels 3 for a local production of solar electrical energy. It is also linked to the electrical energy grid 4 whose electrical energy originates from various sources, such as wind turbine sources 5 or traditional sources 6 (gas, coal, nuclear, etc.). In such a case, the battery recharging management method may comprise an estimation of the future production of solar electrical energy, notably based on weather forecasts.

The recharging device 1 comprises an intelligence, in the form of any type of computer 7, making it possible to implement the above method, and in particular resolve the mathematical equations mentioned, in order to determine the recharging conditions of each battery 11 that is connected. Finally, it comprises an electrical link means 8 with a battery for implementing its recharging and a communication means 9 allowing for the transmission of data with the vehicle and/or its driver, such as the charge level of the battery, the desired charging need. The latter parameter may be transmitted by the driver himself to the recharging device via a human-machine interface or manually or automatically via the electric vehicle itself, based, for example, on an electronic calendar, a telephone, an electronic message, etc.

The invention thus makes it possible to achieve the aims sought and ultimately offers the following advantages:

- since the recharging of the batteries takes into account the real need of each battery, it makes it possible to manage, optimally in time, the recharging of the different batteries, at the most advantageous moments. Furthermore, it allows for a maximum of batteries to be recharged in parallel, since it does not necessarily aim for the maximum and immediate recharging of all the batteries connected to the recharging device;
- the recharging over time of the battery also makes it possible to take into account the different configurations of the available electrical energy sources, and to optimize the charges during advantageous instants, by using a maximum of energy sources that are inexpensive and give little pollution.

Figure 2:
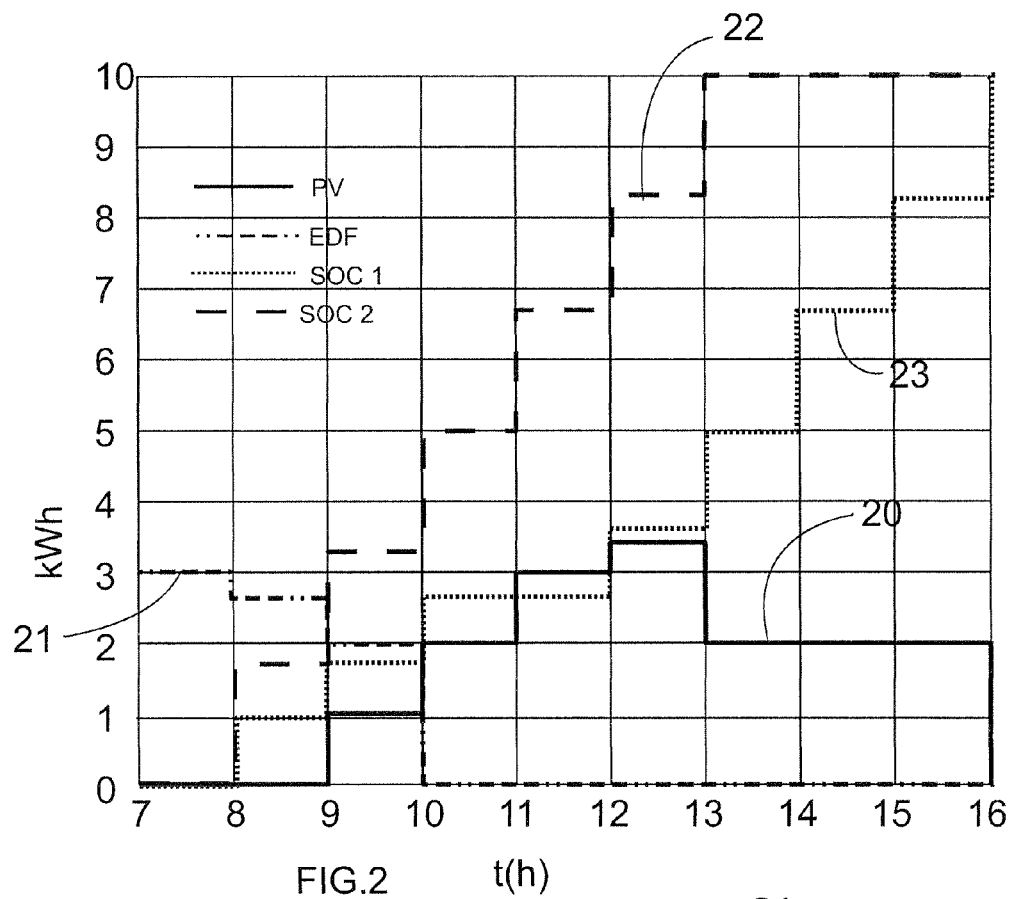
FIG. 2 represents the trend over time of the charging of two batteries and of the energy produced by a recharging device according to an exemplary implementation of the invention.
Figures 3A, 3B:
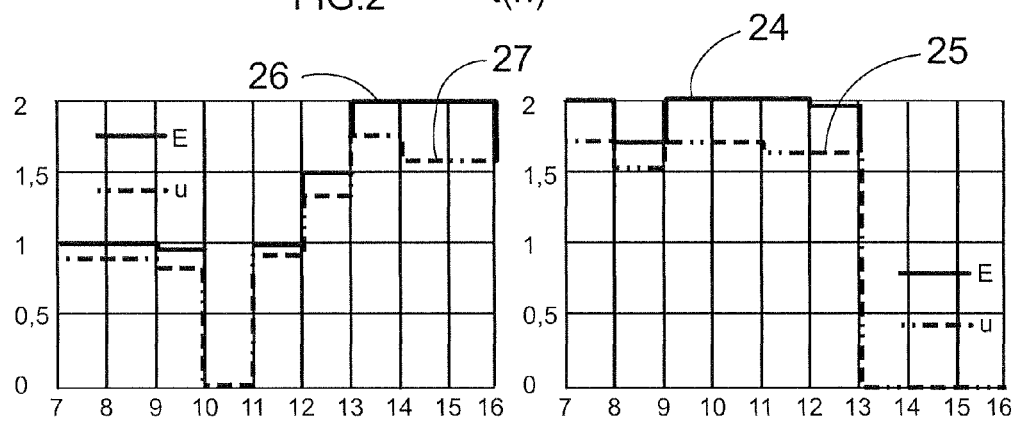
FIGS. 3a and 3b represent the trend over time of the energies transmitted to the two batteries.

FIGS. 2, 3a and 3b illustrate the result obtained by a particular embodiment of the invention, in which two electric devices have to be recharged to full charge, the first for 1 pm and the second for 4 pm. The two electric devices are connected to the recharging device at around 7 am. The recharging device is connected to the national electrical grid and comprises photovoltaic panels for a capacity of 4 kW.

The curves 20 and 21 of FIG. 2 represent the variation over time of, respectively, the electrical production supplied by the photovoltaic panels of the recharging device and the electrical production obtained from the electrical grid. The curves 22 and 23 respectively illustrate the charges of the two batteries as a function of time. It will be noted that, throughout the period with significant sunlight, the electrical energy used originates mainly from the photovoltaic panels. The energy of the electrical grid is used only early in the morning. Furthermore, it clearly appears that the management over time of the recharging makes it entirely possible to achieve the needs of the two devices in terms of time constraints. FIG. 3a comprises the curves 24, 25 which respectively represent the energy injected into the first battery and the energy actually accumulated in this battery, as a function of time. It emerges that this energy is high and relatively constant from 7 am to 1 pm. The difference between the two curves stems from the recharging efficiency of the battery, and represents the recharging losses, as explained previously. FIG. 3b similarly represents the curves 26, 27 which respectively represent the energy injected into the second battery and the energy actually accumulated in this battery, as a function of time. It emerges that this energy is low and relatively constant from 7 am to 1 pm and high between 1 pm and 4 pm. This distribution makes it possible to initially prioritize the recharging of the first battery which has to be ready earlier. It will be noted that, in the first hours in which the two batteries are on charge and in which the sunlight is weak, the recharging device can use a certain minimal electrical energy originating from the electrical grid.

The invention claimed is:

1. Method for managing the recharging of a plurality of batteries, which comprises:
   transmitting information of a desired charge level ($C^i$) for each battery (i) to a device for recharging batteries;
   transmitting a given instant ($T^i$) where the desired charge level must be reached or exceeded to the device for recharging batteries;
   calculating, by a computer of the device for recharging batteries, the necessary recharging energy (e) to supply to each battery to reach at least the desired charge level; and
   calculating, by the computer of the device for recharging batteries, a time of recharging the different batteries, such that the total energy used for the recharging of all batteries is less or equal to the total available energy of a number of electrical energy production sources used for supplying electricity to the device for recharging batteries;
   initiating by the device for recharging batteries an automatic recharging of each battery at the calculated time,
   wherein the recharging enables the battery (i) to reach a charge level (C(i)) greater than or equal to the desired charge level ($C^i$) at the given instant.

2. Method for managing the recharging of the plurality of batteries according to claim 1, wherein the method comprises implementing a recharging of each battery (i) to a charge (C(i)) substantially equal to the desired charge ($C^i$), observing the following condition: $C^i \leq C(i) \leq 1.1\ C^i$.

3. Method for managing the recharging of the plurality of batteries according to claim 1, wherein the method comprises measuring the initial charge level ($C_0^i$) of a battery (i) then a step for measuring its charge level during recharging.

4. Method for managing the recharging of the plurality of batteries according to claim 1, wherein the method comprises accepting energy from a number of electrical energy production sources (j) for the recharging of a battery, and minimizing the total cost for the recharging of the battery by minimizing the sum $\Sigma_{j=1}^{J} \int_0^{T_i} \text{Cost}(j, t)\ S(j, t)\ dt$, in which Cost(j, t) represents the cost of a unit of energy produced by a source j at an instant t and S(j, t) represents the quantity of energy produced by a source j for the recharging of the battery at an instant t, J being the number of energy sources.

5. Method for managing the recharging of the plurality of batteries according to claim 4, wherein the method comprises a minimization of the environmental impact of the recharging of at least one battery, by minimizing the sum $\Sigma_{j=1}^{J} \int_0^{T_i} \text{Env}(j,$ t) S(j, t) dt, in which Env(j, t) represents the environmental impact of a unit of energy produced by a source j at an instant t.

6. Method for managing the recharging of the plurality of batteries according to claim 4, wherein the method comprises a minimization of the total energy $\Sigma_{j=1}^{J}\int_0^{Ti} S(j, t)\, dt$ used for the recharging of at least one battery, and the taking into account of the maximum ($S_{max}^{j}$) energy available for each production source by the condition $S(j\, t) \leq S_{max}^{j}$.

7. Method for managing the recharging of the plurality of batteries according to claim 1, wherein the method comprises accounting for the recharging efficiency ($r_i(t)$) of each battery at the instant t, defined by $C(i) = C_0^{i} + \int_0^{Ti} r_i(t)\, e(i, t)\, dt$, in which $C_0^{i}$ represents the initial charge level of the battery and e(i, t) represents the recharging energy supplied to each battery i at the instant t.

8. Device for recharging at least one battery according to claim 1 wherein the desired charge level is a partial charge.

9. Device for recharging the plurality of batteries, comprising an electrical link means with at least one battery, wherein it comprises a computer configured to manage the recharging of battery plurality of batteries, the computer being programmed to execute instructions in program memory, which when executed by a processor at least:

accept a transmission of information of a desired charge level ($C^i$) for each battery (i) to a device for recharging batteries;

accept a transmission of a given instant ($T^i$) where the desired charge level must be reached or exceeded to the device for recharging batteries;

calculate the necessary recharging energy (e) to supply to each battery to reach at least the desired charge level; and calculate a time of recharging the different batteries, such that the total energy used for the recharging of all batteries is less or equal to the total available energy of a number of electrical energy production sources used for supplying electricity to the device for recharging batteries;

initiate by the device for recharging batteries an automatic recharging of each battery at the calculated time, wherein the recharging enables the battery (i) to reach a charge level (C(i)) greater than or equal to the desired charge level ($C^i$) at the given instant.

10. Device for recharging the plurality of batteries according to claim 9, wherein the device comprises a solar and/or wind turbine electrical energy production means.

11. Device for recharging the plurality of batteries according to claim 9, wherein the device comprises a communication means for the transmission of a desired charge level ($C^i$) for a battery (i) at a given instant ($T^i$).

* * * * *